(12) United States Patent
Ike

(10) Patent No.: US 10,490,518 B2
(45) Date of Patent: Nov. 26, 2019

(54) MEASURING DEVICE

(71) Applicant: AZBIL CORPORATION, Chiyoda-ku (JP)

(72) Inventor: Shinichi Ike, Chiyoda-ku (JP)

(73) Assignee: AZBIL CORPORATION, Chiyoda-ku (JP)

( * ) Notice: Subject to any disclaimer, the term of this patent is extended or adjusted under 35 U.S.C. 154(b) by 0 days.

(21) Appl. No.: 16/046,059

(22) Filed: Jul. 26, 2018

(65) Prior Publication Data
US 2019/0035751 A1 Jan. 31, 2019

(30) Foreign Application Priority Data

Jul. 28, 2017 (JP) ................... 2017-146458

(51) Int. Cl.
*H01L 23/00* (2006.01)
*G01F 1/684* (2006.01)
(Continued)

(52) U.S. Cl.
CPC ............. *H01L 24/05* (2013.01); *G01F 1/684* (2013.01); *G01F 1/688* (2013.01); *G01F 1/6845* (2013.01); *G01F 1/6847* (2013.01); *G01F 1/692* (2013.01); *H01L 24/49* (2013.01); *H01L 24/06* (2013.01); *H01L 24/32* (2013.01); *H01L 24/48* (2013.01); *H01L 24/73* (2013.01); *H01L 24/92* (2013.01); *H01L 2224/04042* (2013.01); *H01L 2224/05548* (2013.01); *H01L 2224/05552* (2013.01); *H01L 2224/06135* (2013.01); *H01L 2224/06155* (2013.01); *H01L 2224/2919* (2013.01); *H01L 2224/32104* (2013.01); *H01L 2224/32225* (2013.01); *H01L 2224/32245* (2013.01);
(Continued)

(58) Field of Classification Search
None
See application file for complete search history.

(56) References Cited

U.S. PATENT DOCUMENTS

2004/0173019 A1\* 9/2004 McMillan ............. G01F 1/6847
73/204.16
2007/0044554 A1\* 3/2007 Higashi ................. G01F 1/6845
73/204.25
(Continued)

FOREIGN PATENT DOCUMENTS

JP 2003-532099 10/2003

*Primary Examiner* — Evren Seven
(74) *Attorney, Agent, or Firm* — Oblon, McClelland, Maier & Neustadt, L.L.P.

(57) ABSTRACT

A measuring device includes two sensor chips that measure a flow rate of a fluid flowing through a pipe, electrode pads extending from a temperature measuring section and from a heater, respectively, toward peripheries of the two sensor chips, and wires that are electrically connected to the electrode pads and via which a measurement signal that is output from the temperature measuring section or the heater is transmitted to outside of the sensor chips. Each of the electrode pads includes a straight portion that extends linearly from the temperature measuring section or the heater and a wide portion that is formed at a leading end of each of the electrode pads and is wider than the straight portion, and an entire surface area of the wide portion is set as a wire-bonding-allowed region, to which one of the wires is to be bonded.

6 Claims, 4 Drawing Sheets

(51) Int. Cl.
*G01F 1/688* (2006.01)
*G01F 1/692* (2006.01)

(52) U.S. Cl.
CPC .............. *H01L 2224/48091* (2013.01); *H01L 2224/48101* (2013.01); *H01L 2224/48153* (2013.01); *H01L 2224/48157* (2013.01); *H01L 2224/4912* (2013.01); *H01L 2224/49111* (2013.01); *H01L 2224/49112* (2013.01); *H01L 2224/73215* (2013.01); *H01L 2224/92165* (2013.01)

(56) References Cited

U.S. PATENT DOCUMENTS

| | | | |
|---|---|---|---|
| 2012/0240674 A1* | 9/2012 | Sakuma | G01F 1/6845 73/204.25 |
| 2013/0192388 A1* | 8/2013 | Kono | G01F 1/6845 73/861.47 |
| 2015/0153209 A1* | 6/2015 | Soreefan | G01F 1/688 73/204.23 |
| 2015/0330820 A1* | 11/2015 | Sakuma | G01F 1/6845 257/417 |
| 2018/0306618 A1* | 10/2018 | Han | G01F 1/6847 |
| 2019/0033108 A1* | 1/2019 | Yamazaki | G01F 1/6847 |
| 2019/0041248 A1* | 2/2019 | Yamazaki | G01F 1/6888 |
| 2019/0049278 A1* | 2/2019 | Yamazaki | G01F 1/696 |

* cited by examiner

MEASURING DEVICE

CROSS-REFERENCE TO RELATED APPLICATIONS

The present application is based on and claims priority to Japanese Application No. 2017-146458, filed Jul. 28, 2017, the entire contents of which are incorporated herein by reference.

BACKGROUND

1. Field of the Disclosure

The present disclosure relates to a measuring device that enables a bonding position for a wire to be clearly defined by a pad of a modified shape in a sensor chip.

2. Description of the Related Art

Measuring devices of various types have been provided in the related art to measure a flow rate of a fluid. Among those devices, the use of measuring devices of a thermal type has started to increase because cost reduction, low power consumption, and the like are relatively easily realized.

A measuring device of a thermal type uses sensor chips (flow sensors) manufactured by using semiconductor manufacturing process technology to measure a flow rate, and the measurement is based on the principle that heat removed from a heater by a fluid changes depending on the flow rate of the fluid.

Such a measuring device of a thermal type is disclosed in, for example, Japanese Unexamined Patent Application Publication (Translation of PCT Application) No. 2003-532099.

SUMMARY

The measuring device in the related art mentioned above is used to measure a flow rate of a fluid flowing through a pipe. In the measuring device mentioned above, sensor chips are disposed on an outer surface of the pipe, and the sensor chips and a substrate are electrically connected to each other by conductive wires. One end of a wire is bonded to an electrode pad of a sensor chip while the other end of the wire is bonded to a lead on a substrate. In this way, it is possible to transmit a measurement signal that is output from a measuring section of the sensor chip to the substrate via the wire.

An electrode pad typically extends linearly with a fixed width from the measuring section. Thus, when one end of a wire is bonded to an electrode pad, it is difficult to identify a region in the electrode pad to which the end of the wire is to be bonded if the electrode pad has a uniform shape as described above. Accordingly, when inspecting a position to which a wire is bonded, it is difficult to determine whether the wire is bonded to a correct position because a wire-bonding-allowed region, to which a wire is to be bonded, in the electrode pad is not clearly defined. In addition, the wire and other components of the device may interfere with each other depending on the position to which the wire is bonded.

Thus, the present disclosure addresses the issues described above, and an object of the present disclosure is to provide a measuring device capable of avoiding interference between a wire and other components of the measuring device by clearly defining a position to which a wire is bonded in an electrode pad of a sensor chip.

A measuring device according to an aspect of the present disclosure includes a sensor chip that includes a measuring section and performs measurement on a component to be measured by causing the measuring section to be in contact with the component to be measured, an electrode pad that is included in the sensor chip and extends from the measuring section toward a periphery of the sensor chip, and a wire that is electrically connected to the electrode pad and via which a measurement signal that is output from the measuring section is transmitted to outside of the sensor chip. The electrode pad includes a straight portion that extends linearly from the measuring section and a changed-width portion that is formed in a leading end portion of the straight portion and has a width that differs from a width of the straight portion, and an entire surface area from the changed-width portion in the electrode pad to a leading end of the electrode pad is set as a wire-bonding-allowed region, to which the wire is to be bonded when the wire is bonded to the electrode pad.

According to the present disclosure, it is possible to avoid interference between a wire and other components of a device by clearly defining a position to which a wire is bonded in an electrode pad of a sensor chip.

DETAILED DESCRIPTION

Hereinafter, embodiments of the present disclosure will be described in detail with reference to the accompanying drawings.

First Embodiment

Figure 1:
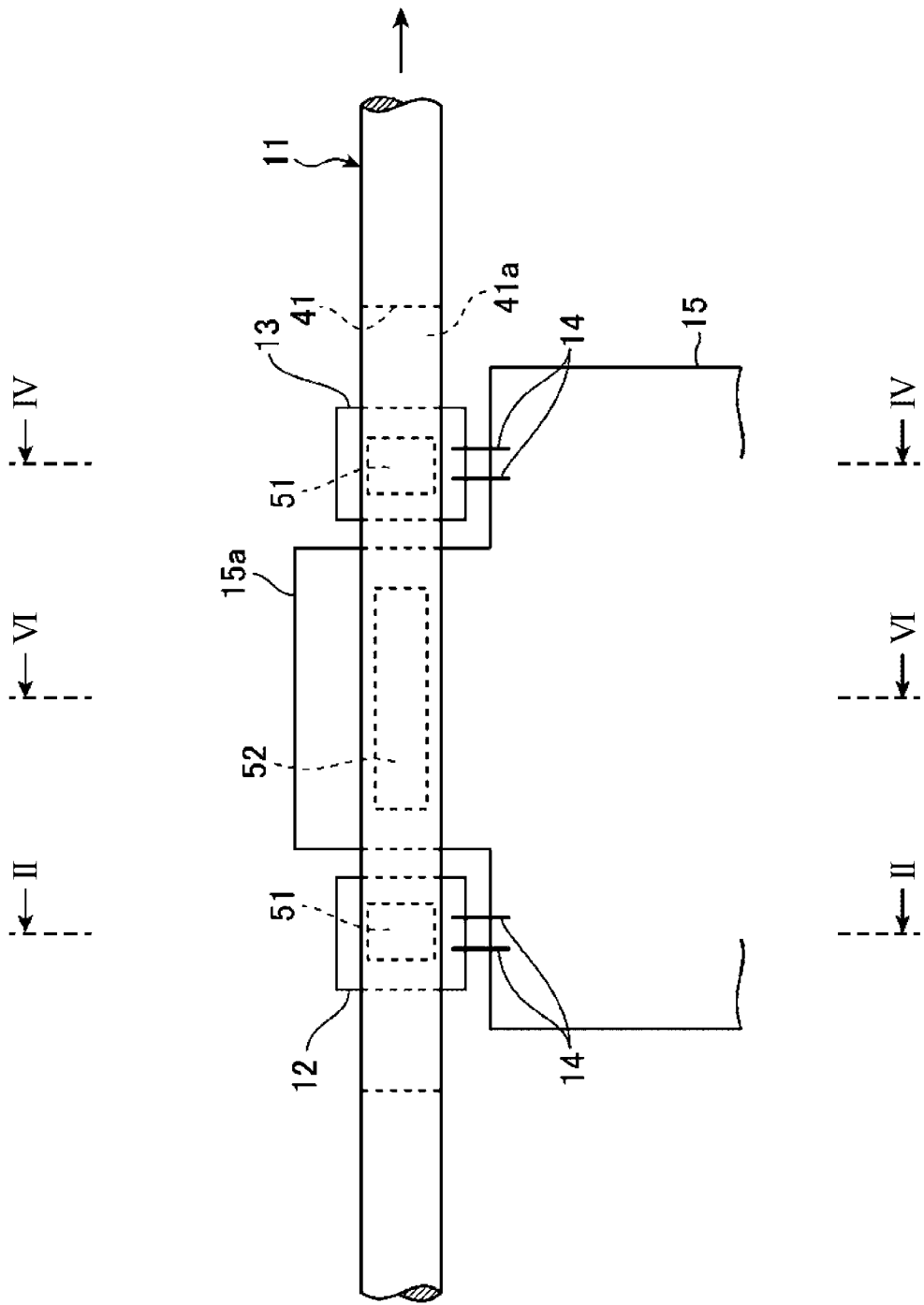
FIG. 1 is a plan view of a measuring device according to a first embodiment of the present disclosure.

As depicted in FIG. 1, a thermal measuring device (flow-rate measuring device) includes a pipe 11, a pair of sensor chips 12 and 13, wires 14, a substrate 15, and other components. The sensor chips 12 and 13 and the substrate 15 are glued and fixed to the pipe 11, and each of the chips 12 and 13 is electrically connected to the substrate 15 by the wires 14, which are conductive.

The pipe 11, which is the component to be measured, is a tubular component with a circular cross section having an internal passage through which a fluid (gas or liquid) can flow. The pipe 11 is made of, for example, glass, ceramics, plastic, stainless steel, or the like. The arrow depicted in FIG. 1 indicates a fluid flow direction.

As depicted in FIGS. 1, 2, 4, and 6, a recess 41 is formed in the middle of the pipe 11 in the axial direction. The recess 41 is recessed into the cylindrical surface of the pipe 11 in the radial direction. The bottom surface 41a of the recess 41 is a flat surface extending in the axial direction of the pipe 11 and serves as a chip attachment surface to which the chips 12 and 13 are attached.

Further, as depicted in FIG. 1, the pair of chips 12 and 13 disposed upstream and downstream, respectively, in the fluid flow direction are thermal flow sensors that measure a flow rate of the fluid flowing through the pipe 11 and are manufactured by using semiconductor manufacturing process technology. The sensor chips 12 and 13, which are semiconductor chips, are disposed in this order along the fluid flow in the axial direction of the pipe 11 on the bottom surface 41a, which is an outer surface of the pipe 11.

The sensor chip 12 disposed upstream in the fluid flow direction is a temperature sensor chip, which measures the temperature of the fluid flowing through the pipe 11. On the other hand, the sensor chip 13 disposed downstream in the fluid flow direction is a heater chip, which supplies the fluid flowing through the pipe 11 with a predetermined amount of heat. Hereinafter, the embodiment will be described with reference to the sensor chip 12 as a temperature sensor chip 12 and with reference to the sensor chip 13 as a heater chip 13.

Figure 2:
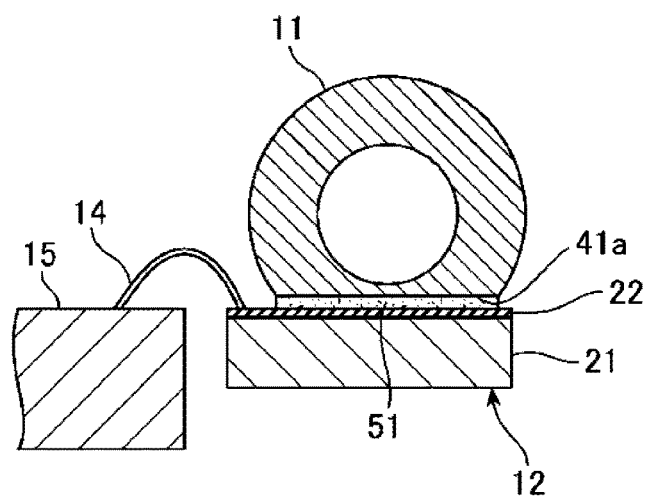
FIG. 2 is a cross-sectional view of the measuring device in FIG. 1 taken along line II-II.
Figure 3:
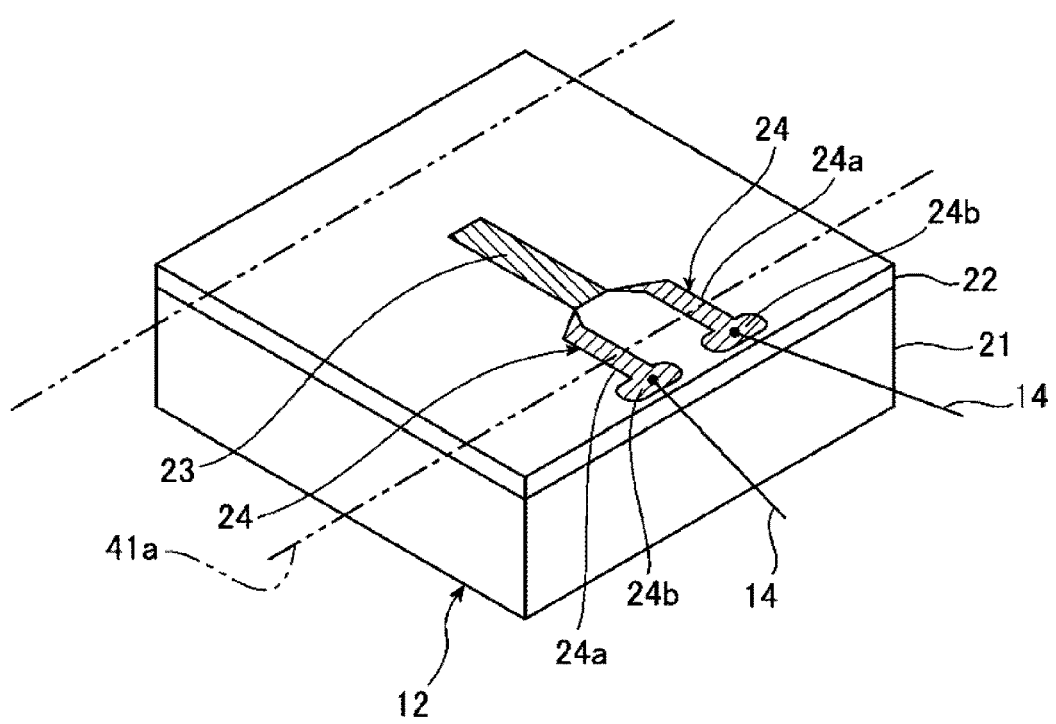
FIG. 3 is a perspective view of a temperature sensor chip.

As depicted in FIGS. 2 and 3, the temperature sensor chip 12 includes, for example, a base substrate 21, an insulator film 22, a temperature measuring section (measuring section) 23, electrode pads 24, and the like and is separated from the substrate 15.

Specifically, the surface of the base substrate 21 is covered with the insulator film 22. The temperature measuring section 23 is disposed at the center of the surface of the insulator film 22 and is electrically connected to base ends of the electrode pads 24. The temperature measuring section 23 measures the temperature of the fluid flowing through the pipe 11, and the two electrode pads 24 extend toward the periphery of the chip from the temperature measuring section 23 on the surface of the insulator film 22. The leading ends of the electrode pads 24 are electrically connected to leads on the substrate 15 by the wires 14.

In other words, one end of each of the wires 14 is bonded to one of the electrode pads 24 as a first bonding point while the other end of each of the wires 14 is bonded to a lead on the substrate 15 as a second bonding point. Thus, a temperature measurement signal that is output from the temperature measuring section 23 is relayed to the substrate 15 via the wires 14 and is transmitted to a flow rate measuring unit (not depicted) from the substrate 15.

Each of the electrode pads 24 includes a straight portion 24a and a wide portion 24b. The straight portion 24a extends linearly in the longitudinal direction of the temperature sensor chip 12 (a direction tangential to the pipe 11 when viewed in cross section) and extends in the longitudinal direction of the straight portion 24a with a fixed width. The wide portion 24b, which is a changed-width portion, is formed at the leading end of the electrode pad 24. The wide portion 24b is wider than the straight portion 24a. The wide portion 24b is disposed outside the pipe 11 in the radial direction of the pipe 11 and is formed at a position that does not overlap the pipe 11 in the radial direction.

In summary, the wide portion 24b is wider than the straight portion 24a and is disposed outside the pipe 11 in the radial direction of the pipe 11. The entire surface area of the wide portion 24b, which is shaped as described above, in the electrode pad 24 is set as a wire-bonding-allowed region, to which one end of the wire 14 is bonded. Thus, setting the entire surface area of the wide portion 24b as the wire-bonding-allowed region enables a bonding position for the wire 14 to be clearly defined.

Figure 4:
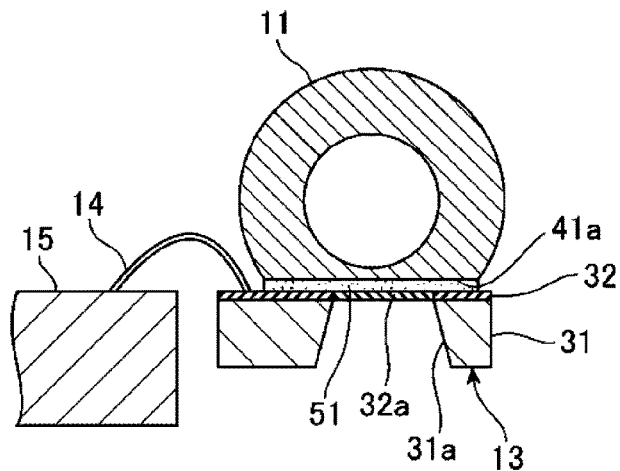
FIG. 4 is a cross-sectional view of the measuring device in FIG. 1 taken along line IV-IV.
Figure 5:
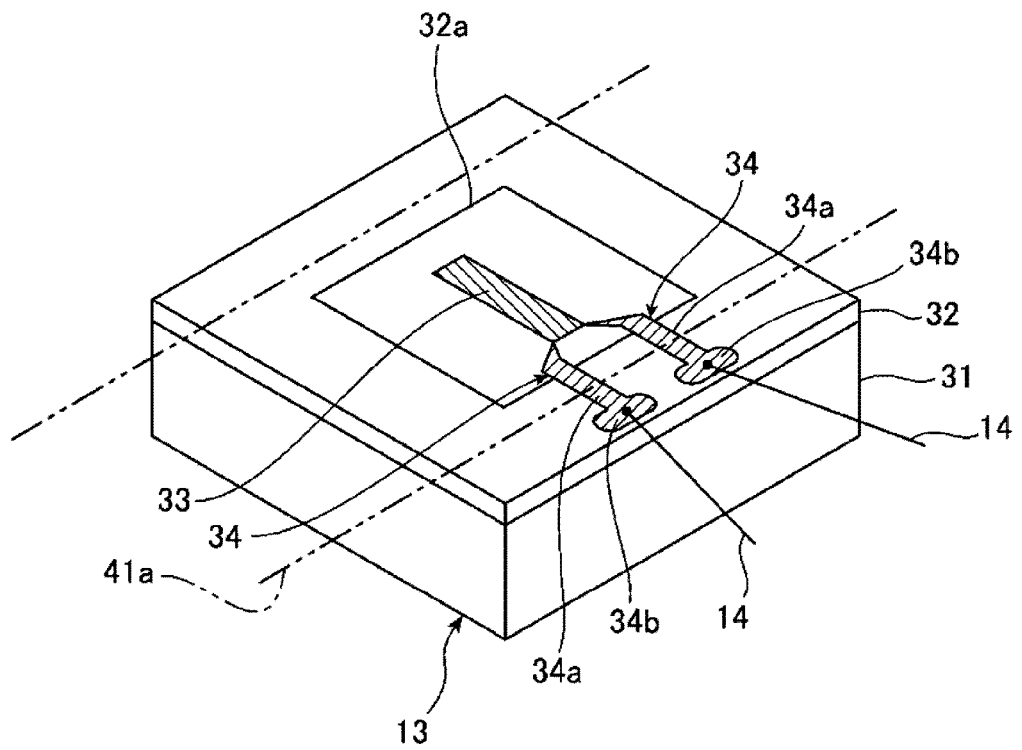
FIG. 5 is a perspective view of a heater chip.

On the other hand, as depicted in FIGS. 4 and 5, the heater chip 13 includes, for example, a base substrate 31, an insulator film 32, a heater (measuring section) 33, electrode pads 34, and the like and is separated from the substrate 15.

Specifically, a cavity 31a is formed at the center of the base substrate 31, and the cavity 31a extends in the thickness direction of the base substrate 31 from one surface to the other surface. The surface of the base substrate 31 is covered with the insulator film 32, and a heat-insulating thin-film diaphragm 32a is disposed at the center of the insulator film 32. In other words, the diaphragm 32a covers the entire upper opening of the cavity 31a from above.

Further, the heater 33 is disposed at the center of the surface of the diaphragm 32a and is electrically connected to base ends of the electrode pads 34. The heater 33 heats the fluid flowing through the pipe 11 to a certain fixed temperature and measures the temperature of the fluid flowing through the pipe 11, and the two electrode pads 34 extend toward the periphery of the chip from the heater 33 on the surface of the insulator film 32. The leading ends of the electrode pads 34 are electrically connected to leads on the substrate 15 by the wires 14.

In other words, one end of each of the wires 14 is bonded to one of the electrode pads 34 as a first bonding point while the other end of each of the wires 14 is bonded to a lead on the substrate 15 as a second bonding point. Thus, a temperature measurement signal that is output from the heater 33 is relayed to the substrate 15 via the wires 14 and is transmitted to the flow rate measuring unit from the substrate 15.

Each of the electrode pads 34 includes a straight portion 34a and a wide portion 34b. The straight portion 34a extends linearly in the longitudinal direction of the heater chip 13 (a direction tangential to the pipe 11 when viewed in cross section) and extends in the longitudinal direction of the straight portion 34a with a fixed width. The wide portion 34b, which is a changed-width portion, is formed at the leading end of the electrode pad 34. The wide portion 34b is wider than the straight portion 34a. The wide portion 34b is disposed outside the pipe 11 in the radial direction of the pipe 11 and is formed at a position that does not overlap the pipe 11 in the radial direction.

In summary, the wide portion 34b is wider than the straight portion 34a and is disposed outside the pipe 11 in the radial direction of the pipe 11. The entire surface area of the wide portion 34b, which is shaped as described above, in the electrode pad 34 is set as a wire-bonding-allowed region, to which one end of the wire 14 is bonded. Thus, setting the entire surface area of the wide portion 24b as the wire-bonding-allowed region enables a bonding position for the wire 14 to be clearly defined.

Thus, forming the wide portions 24b and 34b, which are the wire-bonding-allowed regions, in the electrode pads 24 and 34, respectively, enables bonding positions for the wires 14 to be clearly defined, and one end of each of the wires 14 can be easily bonded. In such a case, in a manufacturing process of the measuring device according to the present disclosure, each of the chips 12 and 13 is electrically connected to the substrate 15 by the wires 14, and subsequently each of the chips 12 and 13 is glued and fixed to the pipe 11. In the fixing procedure, the pipe 11 does not interfere with the wires 14 that are bonded. In other words, bonding each of the wires 14 to one of the wire-bonding-allowed regions is sufficient to avoid interference between the pipe 11 and the wires 14.

Further, as depicted in FIGS. 1, 2, and 4, the chips 12 and 13 are fixed to the outer surface of the pipe 11 by using adhesive 51. Specifically, the center portions of the surfaces of the insulator films 22 and 32 are bonded to the bottom surface 41a of the recess 41 by using the adhesive 51. The adhesive 51 is in contact with the entire surface area of the temperature measuring section 23 and the entire surface area of the heater 33 while in contact with neither the wide portions 24b of the electrode pads 24 nor the wide portions 34b of the electrode pads 34. In other words, the wide portions 24b and 34b are disposed outside the regions having the adhesive 51 on the insulator films 22 and 32, respectively, in the radial direction of the pipe 11.

Figure 6:
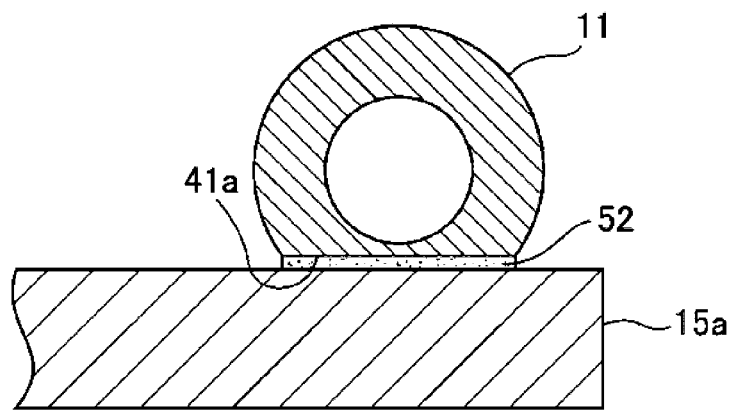
FIG. 6 is a cross-sectional view of the measuring device in FIG. 1 taken along line VI-VI.

In addition, as depicted in FIGS. 1 and 6, a protruding end section 15a of a rectangular shape is formed at the leading edge of the substrate 15. The protruding end section 15a protrudes from the center portion of the leading edge of the substrate 15 toward the outside in the radial direction of the pipe 11. The chips 12 and 13 separated from the substrate 15 are disposed on the left side and on the right side, respectively, of the protruding end section 15a (on both sides of the protruding end section 15a in the axial direction of the pipe 11). In this way, the protruding end section 15a is glued and fixed to the bottom surface 41a of the recess 41 along with the chips 12 and 13. The protruding end section 15a is fixed to the bottom surface 41a of the recess 41 by using adhesive 52.

Of the entire substrate 15, only the protruding end section 15a is glued and fixed to the pipe 11. The temperature sensor chip 12, which has a function of measuring temperature, is disposed upstream of the protruding end section 15a in the fluid flow direction. On the other hand, the heater chip 13, which has a function of supplying heat, is disposed downstream of the protruding end section 15a in the fluid flow direction.

Accordingly, when a flow rate of a fluid flowing through the pipe 11 is measured, the temperature of the fluid flowing through the pipe 11 is measured by the temperature sensor chip 12. The heater chip 13, on the other hand, supplies the fluid flowing through the pipe 11 with heat to increase the temperature of the fluid by a certain amount above the temperature of the fluid (measured temperature) that is measured by the temperature sensor chip 12.

Thus, a heating temperature set for the heater chip 13 varies depending on the measured temperature that is measured by the temperature sensor chip 12, and the heater chip 13 supplies the fluid with an amount of heat that corresponds to a temperature difference between the measured temperature and the heating temperature.

It is known in the related art that an amount of electric energy used by the heater chip 13 to supply the fluid with the amount of heat described above correlates with the flow rate of the fluid flowing through the pipe 11. Thus, the flow rate measuring unit can calculate (measure) the flow rate of the fluid flowing through the pipe 11 in accordance with the amount of electric energy described above.

In the embodiment described above, while the wide portion 24b, which is a changed-width portion, is formed as a wire-bonding-allowed region in the electrode pad 24, a portion of any shape is sufficient for the wire-bonding-allowed region as long as the portion is distinguishable from the straight portion 24a or has a width that differs from the width of the straight portion 24a.

This point will be described in detail in a second embodiment and a third embodiment with reference to FIGS. 7A and 7B. In the following descriptions referencing FIGS. 7A and 7B, one electrode pad 24 is selected to represent the two electrode pads 24 of the temperature sensor chip 12 and the two electrode pads 34 of the heater chip 13.

Second Embodiment

Figure 7A:
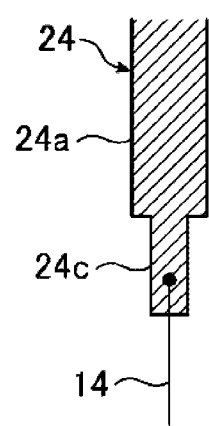
FIG. 7A is an enlarged view of a principal portion of a measuring device according to a second embodiment of the present disclosure, and a narrow portion formed in an electrode pad is enlarged.

As depicted in FIG. 7A, the electrode pad 24 includes the straight portion 24a and a narrow portion 24c. The narrow portion 24c, which is a changed-width portion, is formed at the leading end of the electrode pad 24. The narrow portion 24c is narrower than the straight portion 24a. The narrow portion 24c is disposed outside the pipe 11 in the radial direction of the pipe 11 and is formed at a position that does not overlap the pipe 11 in the radial direction.

In summary, the narrow portion 24c is narrower than the straight portion 24a and is disposed outside the pipe 11 in the radial direction of the pipe 11. The entire surface area of the narrow portion 24c, which is shaped as described above, in the electrode pad 24 is set as a wire-bonding-allowed region, to which one end of the wire 14 is bonded. Thus, setting the entire surface area of the narrow portion 24c as the wire-bonding-allowed region enables a bonding position for the wire 14 to be clearly defined. Thus, bonding each of the wires 14 to one of the wire-bonding-allowed regions is sufficient to avoid interference between the pipe 11 and the wires 14.

Third Embodiment

Figure 7B:
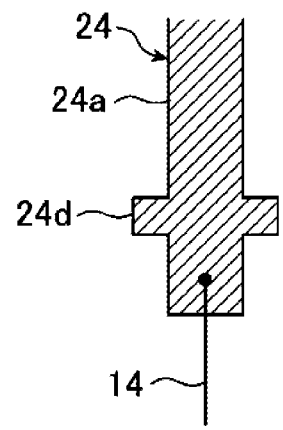
FIG. 7B is an enlarged view of a principal portion of a measuring device according to a third embodiment of the present disclosure, and a boundary portion formed in an electrode pad is enlarged.

As depicted in FIG. 7B, the electrode pad 24 includes the straight portion 24a and a boundary portion 24d. The boundary portion 24d, which is a changed-width portion, is formed in the leading end portion of the electrode pad 24 (at an intermediate position in the leading end portion of the straight portion 24a). The boundary portion 24d is wider than the straight portion 24a. The boundary portion 24d is disposed outside the pipe 11 in the radial direction of the pipe 11 and is formed at a position that does not overlap the pipe 11 in the radial direction.

In summary, the boundary portion 24d is wider than the straight portion 24a and is disposed outside the pipe 11 in the radial direction of the pipe 11. The entire surface area from the boundary portion 24d, which is shaped as described above, to the leading end of the straight portion 24a in the electrode pad 24 is set as a wire-bonding-allowed region, to which one end of the wire 14 is bonded. Thus, setting the entire surface area of the leading end portion including the boundary portion 24d, which is the boundary, as the wire-bonding-allowed region enables a bonding position for the wire 14 to be clearly defined. Thus, bonding each of the wires 14 to one of the wire-bonding-allowed regions is sufficient to avoid interference between the pipe 11 and the wires 14.

As described above, the measuring device according to the present disclosure enables the wire-bonding-allowed regions in the electrode pads 24 and 34 to be easily identifiable by the formation of the wide portion 34b that is distinguishable from the straight portion 34a in addition to the formation of the wide portion 24b, the narrow portion 24c, and the boundary portion 24d that are distinguishable from the straight portion 24a. Consequently, it is possible to clearly define bonding positions for the wires 14 in the electrode pad 24 of the chip 12 and in the electrode pad 34 of the chip 13, and thus it is possible to avoid interference between the pipe 11 and the wires 14 by setting the bonding positions for the wires 14 in the wire-bonding-allowed regions.

If a foreign body is attached to the surfaces of the electrode pads 24 and 34 at the time of bonding the wires 14, the foreign body needs to be removed. By defining the wire-bonding-allowed regions in the electrode pads 24 and 34 as described above, only a foreign body attached to the wire-bonding-allowed regions needs to be removed. Thus, wire bonding to the electrode pads 24 and 34 can be performed efficiently.

Modification of any element in the embodiments or removal of any element in the embodiments is possible within the scope of the present disclosure.

What is claimed is:

1. A device, comprising:
    a sensor chip that includes a measuring section that performs measurement on a component when the measuring section is in contact with the component, the component being a tubular component with a circular cross section, and the sensor chip including an electrode pad that extends from the measuring section toward a periphery of the sensor chip; and
    a wire that is electrically connected to the electrode pad and via which a measurement signal that is output from the measuring section is transmitted to an outside of the sensor chip,
    wherein the electrode pad includes
        a straight portion that extends linearly from the measuring section, and
        a changed-width portion that is formed in a leading end portion of the straight portion and has a width that differs from a width of the straight portion, the changed-width portion being disposed at a position that does not overlap the tubular component in a radial direction of the tubular component, and
    an entire surface area from the changed-width portion in the electrode pad to a leading end of the electrode pad is set as a wire-bonding-allowed region, to which the wire is to be bonded when the wire is bonded to the electrode pad.

2. The device according to claim 1,
    wherein the changed-width portion is a wide portion that is formed at a leading end of the straight portion and has a width that is greater than the width of the straight portion, and
    an entire surface area of the wide portion is set as the wire-bonding-allowed region.

3. The device according to claim 1,
    wherein the changed-width portion is a narrow portion that is formed at a leading end of the straight portion and has a width that is narrower than the width of the straight portion, and
    an entire surface area of the narrow portion is set as the wire-bonding-allowed region.

4. The device according to claim 1,
    wherein the changed-width portion is a boundary portion that is formed at an intermediate position in the leading end portion of the straight portion and has a width that is greater than the width of the straight portion, and
    an entire surface area from the boundary portion to a leading end of the straight portion is set as the wire-bonding-allowed region.

5. The device according to claim 1,
    wherein the component is the tubular component with the circular cross section through which a fluid flows, and
    the sensor chip is a thermal sensor chip to measure a temperature of the fluid.

6. A device, comprising:
    a chip that includes a section that performs heating on a component when the section is in contact with the component, the component being a tubular component with a circular cross section, and the chip including an electrode pad that extends from the section toward a periphery of the chip; and
    a wire that is electrically connected to the electrode pad and via which a signal that is output from the section is transmitted to an outside of the chip,
    wherein the electrode pad includes
        a straight portion that extends linearly from the section, and
        a changed-width portion that is formed in a leading end portion of the straight portion and has a width that differs from a width of the straight portion, the changed-width portion being disposed at a position that does not overlap the tubular component in a radial direction of the tubular component, and
    an entire surface area from the changed-width portion in the electrode pad to a leading end of the electrode pad is set as a wire-bonding-allowed region, to which the wire is to be bonded when the wire is bonded to the electrode pad.

* * * * *